United States Patent
Radi et al.

(10) Patent No.: US 9,657,404 B2
(45) Date of Patent: *May 23, 2017

(54) METHOD OF FORMING METALLIC PATTERN ON POLYMER SUBSTRATE

(71) Applicant: Wistron NeWeb Corp., Hsinchu (TW)

(72) Inventors: Babak Radi, Hsinchu (TW);
Shih-Hong Chen, Hsinchu (TW);
Yu-Fu Kuo, Hsinchu (TW); Tzu-Wen Chuang, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 20 days.

This patent is subject to a terminal disclaimer.

(21) Appl. No.: 14/316,809

(22) Filed: Jun. 27, 2014

(65) Prior Publication Data

US 2015/0376809 A1    Dec. 31, 2015

(51) Int. Cl.
*H05K 3/10* (2006.01)
*C25D 5/02* (2006.01)
*C25D 5/56* (2006.01)
*H05K 3/24* (2006.01)

(52) U.S. Cl.
CPC .................. *C25D 5/02* (2013.01); *C25D 5/56* (2013.01); *H05K 3/105* (2013.01); *H05K 3/24* (2013.01); *H05K 2201/0257* (2013.01); *H05K 2203/107* (2013.01)

(58) Field of Classification Search
CPC ........... H01L 21/76838; H01L 27/1285; H01L 31/0392; H01L 51/0021; H01L 21/4867; H01L 51/0022; H01L 21/28194; H01L 27/3288; H01L 31/0508

See application file for complete search history.

(56) References Cited

U.S. PATENT DOCUMENTS

| 6,348,295 B1 * | 2/2002 | Griffith | B81C 1/00373 257/E21.174 |
|---|---|---|---|
| 9,462,699 B2 * | 10/2016 | Radi | H05K 1/023 |
| 2004/0079195 A1 * | 4/2004 | Perry | B22F 1/0018 75/345 |
| 2005/0037275 A1 * | 2/2005 | Toyoda | B41M 5/24 430/211 |
| 2006/0057502 A1 * | 3/2006 | Okada | C23C 18/14 430/313 |
| 2006/0094189 A1 * | 5/2006 | Zurcher | B22F 9/20 438/257 |
| 2006/0166111 A1 * | 7/2006 | Umetsu | G03F 1/14 430/5 |

(Continued)

*Primary Examiner* — Bac Au
(74) *Attorney, Agent, or Firm* — Jianq Chyun IP Office

(57) ABSTRACT

A method of forming a metallic pattern on a polymer substrate is provided. A mixture layer is formed on a polymer substrate surface. The mixture layer includes an active carrier medium and nanoparticles dispersed in the active carrier medium. A laser process is performed to treat a portion of the mixture layer to form a conductive pattern on the surface of the polymer substrate. A cleaning process is performed to remove an untreated portion of the mixture layer to expose the surface of the polymer substrate, while the conductive pattern is remained on the surface of the polymer substrate. Then, the conductive pattern on the polymer substrate is subjected to an electroplating process to form the metallic pattern over the conductive pattern on the polymer substrate.

9 Claims, 3 Drawing Sheets

(56) References Cited

U.S. PATENT DOCUMENTS

2009/0291230 A1* 11/2009 Lin ..................... C09D 11/102
427/553
2015/0366072 A1* 12/2015 Radi ..................... H05K 3/107
29/846

* cited by examiner

METHOD OF FORMING METALLIC PATTERN ON POLYMER SUBSTRATE

BACKGROUND OF THE INVENTION

1. Field of the Invention

The present invention generally relates to a process, in particular, to a method of forming a metallic pattern on a polymer substrate.

2. Description of Related Art

As technology advances, portable electronic devices, such as smart phones, tablet PCs, notebook PCs, etc., becomes more compact and lighter for easy carrying. For the purpose of miniaturization, the portable electronic device may be incorporated complicated circuitry as well as antenna formed by the LDS (laser direct structuring) technology, for compactness and efficiency. However, special LDS materials and specialized instruments required for the LDS technology lead to high production costs.

SUMMARY OF THE INVENTION

Accordingly, the present invention is directed to a manufacturing method of a metallic pattern over a polymer substrate, which offers high quality products with lower production costs.

The present invention provides a method of forming a metallic pattern on a polymer substrate. A mixture layer is formed on a polymer substrate surface. The mixture layer includes an active carrier medium and nanoparticles dispersed in the active carrier medium. A laser process is performed to treat a portion of the mixture layer to form a conductive pattern on the surface of the polymer substrate. A cleaning process is performed to remove an untreated portion of the mixture layer to expose the surface of the polymer substrate, while the conductive pattern is remained on the surface of the polymer substrate. Then, the conductive pattern on the polymer substrate is subjected to an electroplating process to form the metallic pattern over the conductive pattern on the polymer substrate.

According to an embodiment of the invention, a material of the polymer substrate includes nylons, polycarbonates (PC), acrylonitrile butadiene styrene (ABS), PC/ABS, polyethylene terephthalate (PET), polyether ether ketone (PEEK), polytetrafluoroethylene (PTFE) or liquid crystal polymers (LCP).

According to an embodiment of the invention, a material of the nanoparticles includes copper oxide, copper, silver or gold.

According to an embodiment of the invention, a material of the nanoparticles includes copper oxide. The laser process is performed by using a UV laser at 355 nm with a power of 0.2~0.4 W and 80% overlapping of laser spots and the laser process is a laser ablation process. The conductive pattern is a copper layer.

According to an embodiment of the invention, the electroplating process includes a copper electroplating process and the metallic pattern includes a copper pattern.

According to an embodiment of the invention, the nanoparticles have an average size below 100 nm.

According to an embodiment of the invention, a content of the nanoparticles in the mixture layer ranges from 20 wt % to 40 wt %, relative to a total weight of the mixture layer.

According to an embodiment of the invention, a material of the active carrier medium includes polyvinylpyrrolidone (PVP) or polyethylene oxide (PEO).

According to an embodiment of the invention, the step of forming the mixture layer includes forming the mixture layer by spraying, spin coating, dip coating, screen printing, pad printing or smearing.

According to an embodiment of the invention, a position of the conductive pattern corresponds to a position of the metallic pattern.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
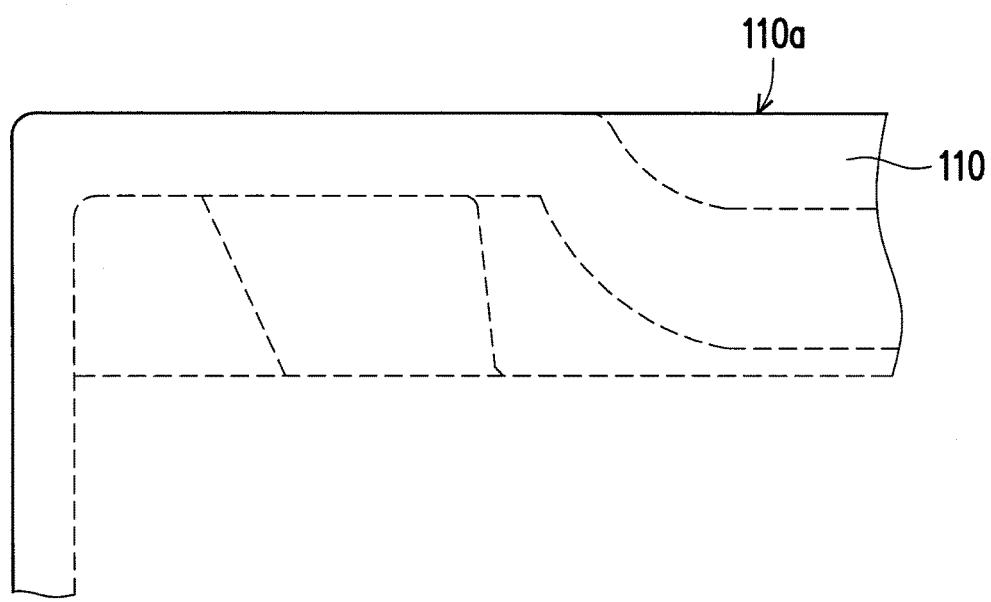
FIGS. 1-5 schematically illustrate a method of forming a metallic pattern on a polymer substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

FIGS. 1-5 schematically illustrate a method of forming a metallic pattern on a polymer substrate according to an embodiment of the present invention. Referring to FIG. 1, a polymer substrate 110 is provided. The polymer substrate 110 may be a polymer film, a casing body or even a circuit board, and may be made of a polymer material by injection molding technology. The polymer material may be nylons, polycarbonates (PC), acrylonitrile butadiene styrene (ABS), PC/ABS, polyethylene terephthalate (PET), polyether ether ketone (PEEK), polytetrafluoroethylene (PTFE), liquid crystal polymers (LCP) or any suitable plastic material(s). The polymer substrate 110 needs not to be made of LDS-specific polymers (i.e. the polymer materials specifically designed for the laser direct structuring (LDS) process). The polymer substrate 110 may be a part or parts of an electronic device, and the electronic device may be, for example, a smart phone or a tablet PC, and the metallic pattern may be an antenna part or a three-dimensional circuit incorporated within the electronic device.

Figure 2:
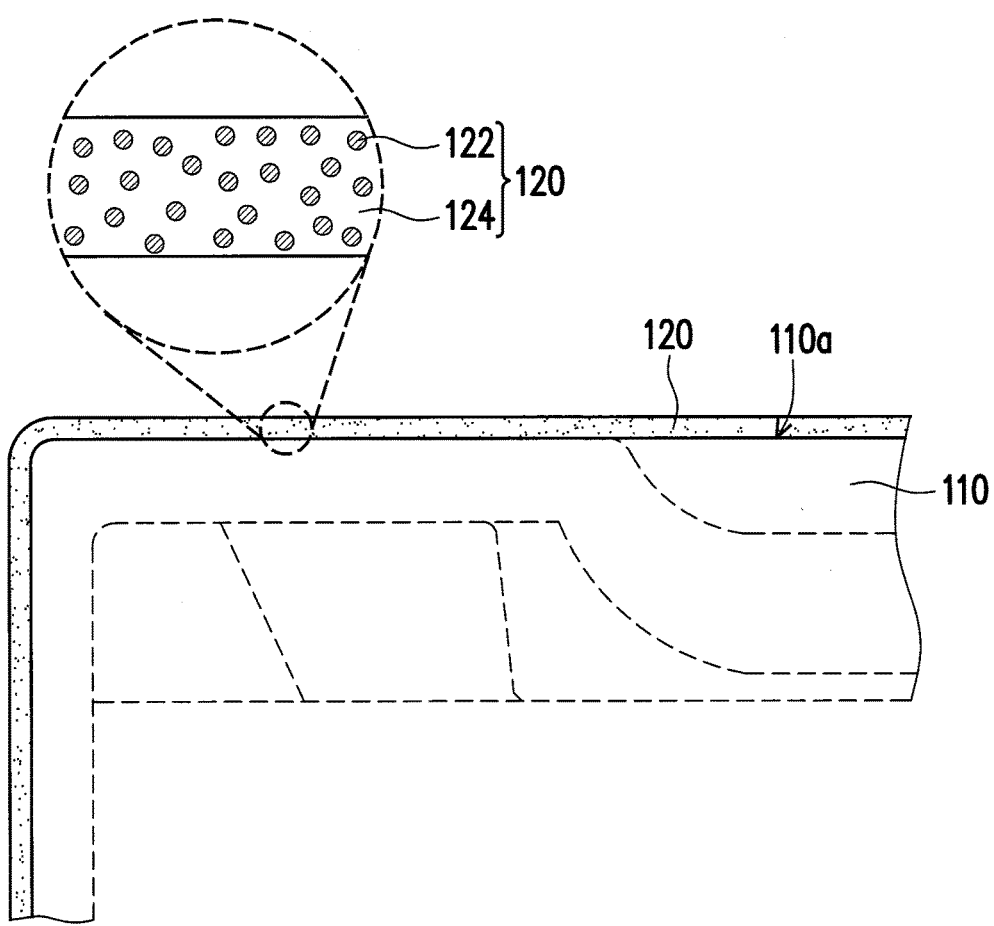

Subsequently, referring to FIG. 2, a mixture layer 120 is formed on the surface 110a of the polymer substrate 110 by spraying, spin coating, dip coating, screen printing, pad printing or smearing, for example. The mixture layer 120 includes at least nanoparticles 122 and an active carrier medium 124. The nanoparticles 122 may be metallic nanoparticles made of copper oxide, or metal nanoparticles made of copper, silver or gold, for example. Preferably, the nanoparticles 122 may be copper oxide nanoparticles, for example. The nanoparticles may have an average size below 100 nm, for example. The content of the nanoparticles 122 of the mixture layer 120 may be at least 20 wt %, preferably 20 wt %-40 wt %, relative to the total weight of the mixture layer 120. The material of the active carrier medium 124 may be polyvinylpyrrolidone (PVP), polyethylene oxide (PEO) and the like. In general, the active carrier medium 124 may be removed in the subsequent process by solvent washing and laser treatment, for example.

Figure 3:
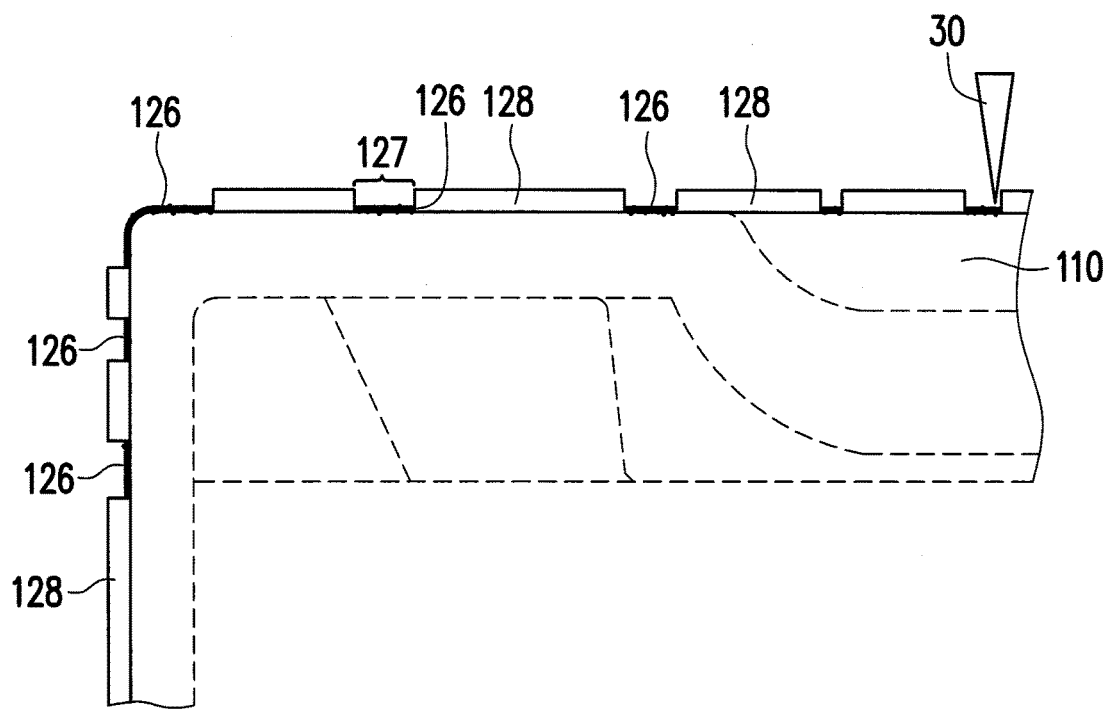

Referring to FIG. 3, a laser process 30 is performed to treat a portion of the mixture layer 120 to form a conductive portion 126. The position of the conductive portion 126 corresponds to the position of the metallic pattern to be formed in the subsequent process. The type of the laser used in the laser process depends on the type and size of the nanoparticles 122 within the mixture layer 120. For treating the copper oxide nanoparticles, the laser used in the laser process 30 may be a UV laser at 355 nm with a power of 0.2~0.4 W and 80% overlapping of laser spot for example. For treating the silver nanoparticles, the laser used in the laser process 30 may be a green light laser at 532 nm, for example. Basically, the intensity of the laser may be relatively lower due to high surface area and absorption of the nanoparticles through surface plasmon resonance effect. For example, the laser process 30 is a laser ablation process.

Upon laser illumination, nanoparticles, especially metal or metallic nanoparticles, efficiently generate heat (release heat) and the released heat transfers from the nanoparticles to the surrounding matrix or medium. The heating effect of the nanoparticles becomes strongly enhanced under plasmon resonance or when the laser frequency hits the collective resonance of the nanoparticle.

Taking advantages of the heating effect enhanced under plasmon resonance, the nanoparticles 122 in the treated portion 127 of the mixture layer 120 are fused and turned into the conductive pattern 126 during the laser process 30 and the conductive pattern 126 is tightly fixed to the surface 110a. Because the formation of the conductive pattern 126 is activated by laser, the location and the shape of the pattern can be precisely controlled. The conductive pattern 126 may be a very thin conductive layer (a metal layer or a metallic layer) of a continuous pattern or discontinuous patterns. The thickness of the conductive pattern 126 may be very thin and less than 1 micron, as long as it remains to be conductive. Using the nanoparticles made of copper oxide as an example, the conductive pattern 126 may be a very thin copper layer. The conductive pattern 126 can function as the conductive seed layer for the subsequent electroplating process.

Figure 4:
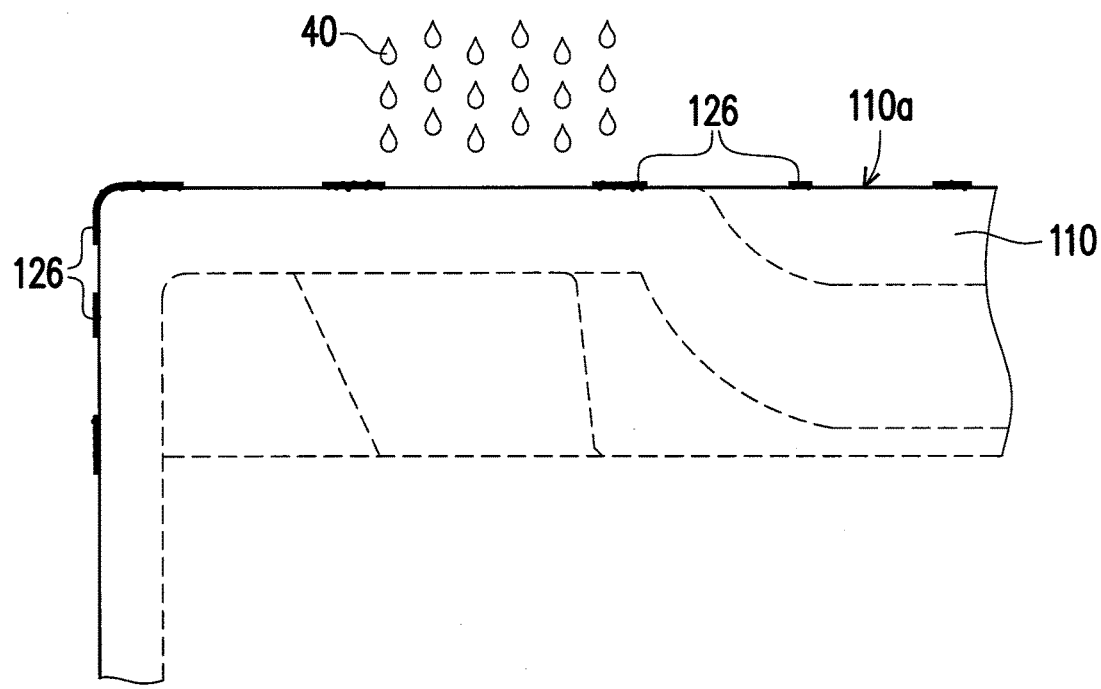

Referring to FIG. 4, after the laser process 30, a cleaning process 40 is performed to remove the untreated portion 128 (see FIG. 3) of the mixture layer 120 to expose the surface 110a of the polymer substrate 110, while the conductive pattern 126 is remained on the surface 110a of the polymer substrate 110. The solvent used in the cleaning process may be water, acetone or suitable alcohols, for example.

Figure 5:
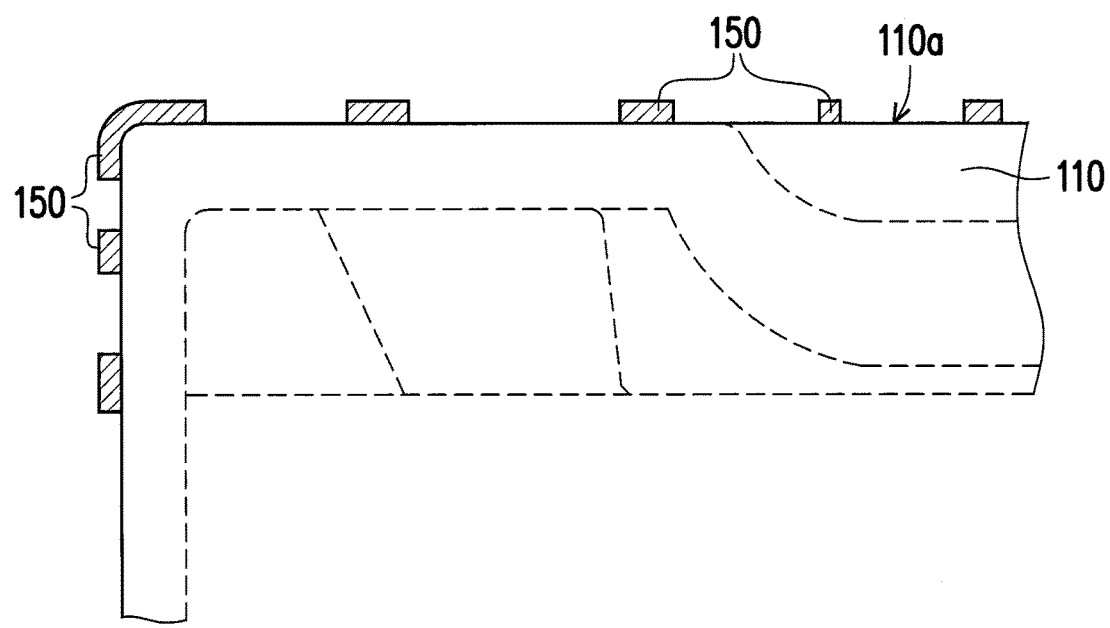

Referring to FIG. 5, the polymer substrate 110 and the conductive pattern 126 remained on the surface 110a of the polymer substrate 110 are further processed with an electroplating process to form a metallic pattern 150. As the conductive pattern 126 functions as the conductive seed layer for electroplating, the metallic pattern 150 is formed exactly on the conductive pattern 126. The region other than that occupied by the conductive pattern 126 (i.e. the exposed polymer surface 110a from the removal of the untreated portion 128) is not conductive and no electroplating occurs. The conductive pattern 126 is merely a very thin metal layer, it can be easily incorporated into the metallic pattern 150 during the electroplating process and both may be viewed as an integral body. For example, the electroplating process may be a copper electroplating process, the conductive pattern 126 may be a very thin copper layer and the metallic pattern 150 may be a copper pattern. A thickness of the metallic pattern 150 may be no more than 20 microns, for example. Because the position of the conductive portion 126 corresponds to the position of the metallic pattern 150, the metallic pattern 150 may be composed of a continuous pattern or discontinuous patterns. Also, since the location and the shape of the conductive pattern 126 can be precisely controlled, the pattern fidelity of the metallic pattern 150 is high. By using laser, the obtained metallic pattern can have a very precise pattern outline. Also, as the scanning of laser is adaptable to the topography or configuration of the substrate, the metallic pattern can be formed on a planar surface or over a non-planar object.

The polymer substrate 110 may be a part or parts of an electronic device, such as a smart phone or a tablet PC, and the metallic pattern 150 may be an antenna part or a three-dimensional circuit incorporated within the electronic device. The polymer substrate and the metallic pattern formed thereon may be an injection-molded thermoplastic part with integrated electronic circuit traces, for example. The manufacturing method of the present invention may be applied to produce a molded interconnect device (MID), or parts (such as handset antenna or 3D electronic circuitry) of electronic products in the fields of consumer electronics, telecommunication, automobiles and/or medical instruments.

Compared with the prior laser direct structuring (LDS) technology, the manufacturing method of the present invention can be applied to any suitable polymer substrate to form the metallic pattern and there is no need to use LDS-specific polymer material(s), which are more expensive and with high color dependency. By using the manufacturing method of the present invention, nanoparticles of lower costs (e.g. copper oxide nanoparticles) may be used. In addition, a reasonable amount of nanoparticles is needed to form the conductive pattern of a minimum thickness. By using laser, the obtained metallic pattern can have a very precise pattern layout and can be formed on a planar surface or over a non-planar contour.

By using the manufacturing method of the present invention, the production costs may be lower and the flexibility of processing becomes higher for more choices in substrate materials. Also, high quality products may be manufactured by providing products with high pattern fidelity and less color dependency of the substrate.

The manufacturing method described in the embodiments can be equitably applied to form the circuits, wirings or metallic parts for portable electronic devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metallic pattern on a polymer substrate, comprising:
   providing a polymer substrate, wherein a material of the polymer substrate includes nylons, polycarbonates (PC), acrylonitrile butadiene styrene (ABS), PC/ABS, polyethylene terephthalate (PET), polyether ether ketone (PEEK), polytetrafluoroethylene (PTFE) or liquid crystal polymers (LCP);
   forming a mixture layer on a surface of the polymer substrate, wherein the mixture layer includes an active carrier medium and nanoparticles dispersed in the active carrier medium, wherein a material of the active carrier medium includes polyvinylpyrrolidone (PVP) or polyethylene oxide (PEO);

fusing the nanoparticles in a portion of the mixture layer by treating the mixture layer with a laser process for forming a conductive pattern on the surface of the polymer substrate, wherein the nanoparticles are fused together through the heat generated from the nanoparticles during the laser process, and wherein the laser process is performed by using a UV laser at 355 nm with a power of 0.2~0.4 W and 80% overlapping and the laser process is a laser ablation process;

performing a cleaning process to remove an untreated portion of the mixture layer to expose the surface of the polymer substrate, while the conductive pattern is remained on the surface of the polymer substrate; and subjecting the conductive pattern on the polymer substrate to an electroplating process to form the metallic pattern on the conductive pattern.

2. The method according to claim 1, wherein a material of the nanoparticles includes copper oxide, copper, silver or gold.

3. The method according to claim 1, wherein a material of the nanoparticles includes copper oxide.

4. The method according to claim 3, wherein the conductive pattern is a copper layer.

5. The method according to claim 3, wherein the electroplating process includes a copper electroplating process and the metallic pattern includes a copper pattern.

6. The method according to claim 1, wherein the nanoparticles have an average size below 100 nm.

7. The method according to claim 1, wherein a content of the nanoparticles in the mixture layer ranges from 20 wt % to 40 wt %, relative to a total weight of the mixture layer.

8. The method according to claim 1, wherein forming the mixture layer includes forming the mixture layer by spraying, spin coating, dip coating, screen printing, pad printing or smearing.

9. The method according to claim 1, wherein a position of the conductive pattern corresponds to a position of the metallic pattern.

\* \* \* \* \*